(12) United States Patent
Ezaki et al.

(10) Patent No.: US 8,206,832 B2
(45) Date of Patent: Jun. 26, 2012

(54) PHOTOSENSITIVE THERMOSETTING RESIN COMPOSITION AND FLEXIBLE PRINTED CIRCUIT BOARD

(75) Inventors: Tetsuya Ezaki, Kawaguchi (JP); Masakazu Fujiwara, Kawaguchi (JP); Masanobu Yanahara, Kawaguchi (JP)

(73) Assignee: Kyocera Chemical Corporation, Kawaguchi-shi (JP)

( * ) Notice: Subject to any disclaimer, the term of this patent is extended or adjusted under 35 U.S.C. 154(b) by 448 days.

(21) Appl. No.: 12/312,928

(22) PCT Filed: Nov. 29, 2007

(86) PCT No.: PCT/JP2007/073027
§ 371 (c)(1),
(2), (4) Date: Jun. 1, 2009

(87) PCT Pub. No.: WO2008/066101
PCT Pub. Date: Jun. 5, 2008

(65) Prior Publication Data
US 2010/0025084 A1    Feb. 4, 2010

(30) Foreign Application Priority Data
Dec. 1, 2006    (JP) ................................. 2006-326177

(51) Int. Cl.
B32B 15/08    (2006.01)
B32B 15/082    (2006.01)
B32B 15/20    (2006.01)
B32B 27/18    (2006.01)
B32B 27/26    (2006.01)

(52) U.S. Cl. ..................... 428/458; 428/457; 428/474.4; 428/413; 428/704; 524/115; 524/116; 524/117; 524/126; 524/133; 524/136; 524/138; 524/139; 106/15.05; 106/18.14; 106/18.18; 106/18.31; 525/528

(58) Field of Classification Search .................. None
See application file for complete search history.

(56) References Cited

U.S. PATENT DOCUMENTS

| | | | | |
|---|---|---|---|---|
| 4,440,921 A * | 4/1984 | Allcock et al. | ................ | 528/168 |
| 5,047,270 A * | 9/1991 | Mori et al. | .................. | 428/35.2 |
| 5,948,514 A | 9/1999 | Komori et al. | | |
| 6,596,893 B2 * | 7/2003 | Nakacho et al. | ............... | 558/157 |
| 7,317,046 B2 * | 1/2008 | Fukuoka et al. | ............... | 524/116 |
| 7,521,511 B2 * | 4/2009 | Tanaka et al. | ................ | 525/396 |
| 7,671,147 B2 * | 3/2010 | Urakawa et al. | ............... | 525/526 |
| 7,910,631 B2 * | 3/2011 | Fujii et al. | ...................... | 522/171 |
| 2003/0187107 A1 * | 10/2003 | Sumiyoshi et al. | ............. | 524/95 |
| 2005/0107556 A1 | 5/2005 | Tamura et al. | | |
| 2007/0040154 A1 * | 2/2007 | Murakami | ..................... | 252/609 |

FOREIGN PATENT DOCUMENTS

| | | | |
|---|---|---|---|
| EP | 1 279 720 | * | 1/2003 |
| JP | 62 38449 | | 2/1987 |
| JP | 9 54434 | | 2/1997 |
| JP | 2001 72836 | | 3/2001 |
| JP | 2001-072836 | * | 3/2001 |
| JP | 2002 6487 | | 1/2002 |
| JP | 2002 6488 | | 1/2002 |
| JP | 2002 265567 | | 9/2002 |
| JP | 2002-265567 | * | 9/2002 |
| JP | 2003 212954 | | 7/2003 |
| JP | 2005-173577 | * | 6/2005 |
| JP | 2005 173577 | | 6/2005 |
| JP | 2005-283762 | * | 10/2005 |
| JP | 2005 283762 | | 10/2005 |
| JP | 2007 147722 | | 6/2007 |
| JP | 2007 304542 | | 11/2007 |
| WO | WO 2006-096033 | * | 9/2006 |

OTHER PUBLICATIONS

Japanese Standards Association, "Test methods of copper-clad laminates for flexible printed wiring boards", Japanese Industrial Standard, JIS C 6471, 1995, 35 Pages.
Japanese Standards Association, "General Rules of Coating Films for Automobile Parts", Japanese Industrial Standard, JIS D 0202, 1988, 17 Pages.

* cited by examiner

Primary Examiner — Vivian Chen
(74) Attorney, Agent, or Firm — Oblon, Spivak, McClelland, Maier & Neustadt, L.L.P.

(57) ABSTRACT

There is provided a photosensitive thermosetting resin composition of an alkali development type from which it is possible to form a coating film that is halogen-free yet has high-level flame retardancy, has a superior low warpage property after it is cured, is excellent in plasticity, resolution, soldering heat resistance, chemical resistance, and the like, and a flexible printed circuit board using the same. There is provided a photosensitive thermosetting resin composition of an alkali development type and a flexible printed circuit board using the same, the photosensitive thermosetting resin composition including: (A) a resin component having a (meth)acryloyl group and a carboxyl group in one molecule and soluble in a dilute alkali solution; (B) a phosphorus-containing epoxy thermosetting resin component; (C) a photopolymerization initiator; (D) an organophosphorus compound; and (E) a diluent, and having excellent performance in all the properties comparable to those of conventional photosensitive thermosetting resin compositions using brominated epoxy resin and a halogen-based flame retardant, and having an excellent property of not generating hydrogen bromide which has been a problem at the time of the combustion.

14 Claims, No Drawings

PHOTOSENSITIVE THERMOSETTING RESIN COMPOSITION AND FLEXIBLE PRINTED CIRCUIT BOARD

TECHNICAL FIELD

The present invention relates to a photosensitive thermosetting resin composition of an alkali development type that is halogen-free yet has flame retardancy, does not produce toxic gas such as hydrogen bromide and dioxins when it is burned, and to a flexible printed circuit board.

BACKGROUND ART

In order to protect a wiring pattern formed on a substrate by a method such as screen printing from an external environment or in order to protect a printed circuit board from the adhesion of solder on its part where soldering is not necessary in a soldering process performed when electronic components are surface-mounted on the printed circuit board, a protective film called a cover coat or a solder mask is used. This protective film covers the printed circuit board and exhibits a protecting function.

As a material of such a protective film, for example, an epoxy resin composition has been used for a thermosetting solder resist, but it has been difficult to use the epoxy resin as it is because of its easy flammability. Therefore, in order to give flame retardancy to the resin composition, a halogen-based flame retardant is added or brominated epoxy resin which contains bromine in its skeleton is used (see, for example, JP-A 9-054434 (KOKAI)).

However, after it was reported that decabromodiphenyl oxide which is the most typical bromine-based retardant generates toxic brominated dibenzoxide and furan when it is burned, there has arisen a doubt about safety of all the bromide-based flame retardants. Further, when resin using the conventional bromine-based flame retardant is burned, toxic gas such as dioxins is produced, which gives a great load to the environment when it is burned and when it is discarded.

Further, in order to cope with an environmental problem, an organophosphorus-based flame retardant has recently been used instead of the bromine-based flame retardant. However, the organophosphorus-based flame retardant is not very excellent in flame retardancy, and has to be added in more amount than the bromine-based flame retardant in order to give the same level of flame retardancy to a resin composition, and thus involves problems such as property deterioration of the composition and bleeding.

Reference 1: JP-A 9-054434 (KOKAI)

DISCLOSURE OF THE INVENTION

Therefore, it is an object of the present invention to provide a photosensitive thermosetting resin composition of an alkali development type from which it is possible to form a coating film that has high-level flame retardancy even without using a halogen-based flame retardant for making the resin composition flame-retardant, has a superior low warpage property after it is cured, and is excellent in plasticity, resolution, soldering heat resistance, chemical resistance, and the like, and to provide a flexible printed circuit board using the same.

As a result of studious studies for solving the aforesaid problems, the present inventors have found out that it is possible to solve the aforesaid problems if a resin composition as a photosensitive thermosetting resin composition of an alkali development type contains both a phosphorus-containing epoxy thermosetting component and a different organophosphorus compound, instead of a halogen-containing compound, and has completed the present invention.

Specifically, a photosensitive thermosetting resin composition of the present invention includes (A) a resin component having a (meth)acryloyl group and a carboxyl group in one molecule and soluble in a dilute alkali solution, (B) a phosphorus-containing epoxy thermosetting component, (C) a photopolymerization initiator, (D) an organophosphorus compound other than the (B) component, and (E) a diluent.

A flexible printed circuit board according to another aspect of the present invention comprises a polyimide layer and a copper layer or including a polyimide layer, an adhesive layer, and a copper layer, and have a resin layer made of the photosensitive thermosetting resin composition of the present invention provided on a surface of the flexible printed circuit board.

From the photosensitive thermosetting resin composition of the present invention, it is possible to form a coating film having high-level flame retardancy even without using brominated epoxy resin or a halogen-based flame retardant, having a superior low warpage property after it is cured, and excellent in plasticity, resolution, soldering heat resistance, chemical resistance, and the like.

Further, owing to the use of the photosensitive thermosetting resin composition having the aforesaid excellent properties, the flexible printed circuit board of the present invention does not produce toxic gas such as hydrogen bromide and dioxins, which have been regarded as a problem when the resin composition is burned, and thus can reduce a load to the environment.

BEST MODE FOR CARRYING OUT THE INVENTION

Hereinafter, the present invention will be described in detail.

(A) a resin component soluble in a dilute alkali solution used in the present invention has a (meth)acrylol group and a carboxyl group in one molecule and is soluble in a dilute alkali solution. When this component is irradiated with an active energy ray such as an ultraviolet ray, the (meta)acryloyl groups in its molecules are polymerized by a radical generated from (C) a photopolymerization initiator, which will be described later, and as a result, this component acts to make a resin composition insoluble.

An example of (A) the resin component soluble in the dilute alkali solution is an epoxy acrylate compound (for example, epoxy acrylate oligomer) which is derived in such a manner that epoxy resin is acryl-modified by an esterification reaction between itself and (meth)acrylic acid and an acid anhydride is further added.

As the epoxy resin which is a raw material of the epoxy acrylate compound, well-known epoxy resin is usable, and in particular, commonly used bisphenol epoxy resin or the like is preferably usable. Further, as the (meth)acrylic acid which is a raw material, acrylic acid, methacrylic acid, or a mixture of these is usable. Further, as the acid anhydride which is a raw material, usable is phthalic anhydride, succinic anhydride, maleic anhydride, tetrahydrophthalic anhydride, hexahydrophthalic anhydride, methylhexahydrophthalic anhydride, methyltetrahydrophthalic anhydride, itaconic anhydride, methylendomethylene tetrahydrophthalic anhydride, or the like, and among all, succinic anhydride or phthalic anhydride is preferably used.

Further, as (A) the resin component soluble in the dilute alkali solution, also usable is a carboxyl group-containing urethane compound (for example, a carboxyl group-containing urethane oligomer) which is derived by the reaction of a polyol compound, a polybasic acid anhydride having two anhydrides in a molecule, and (meth)acrylic acid having one epoxy group in a molecule.

(A) the resin component soluble in the dilute alkali solution of the present invention preferably has an acid value within a range of 30 to 200 mgKOH/g, and if the acid value of a resin component as (A) the component soluble in the dilute alkali solution is less than 30 mgKOH/g, its alkali solubility is lowered, which makes alkali development difficult, and if the acid value is over 200 mgKOH/g, there occurs a great reduction in film thickness at the time of the development in the use as an alkali development-type photoresist, which may possibly result in a great decrease in resolution. The acid value of (A) the resin component soluble in the dilute alkali solution is more preferably within a range of 50 to 150 mgKOH/g.

An amount of (A) the resin component soluble in the dilute alkali solution blended in the whole photosensitive thermosetting resin composition of the present invention is preferably 20 to 70 mass %.

(B) a phosphorus-containing epoxy resin component used in the present invention is derived by the introduction of a phosphoric acid ester group into epoxy resin as a result of the reaction of a compound having the phosphoric acid ester group with the epoxy resin.

As the compound having the phosphoric acid ester group used here, a phosphorus compound as a (G) component represented by the following general formula (1), (2), or (3) is preferable, for instance,

[formula 1]

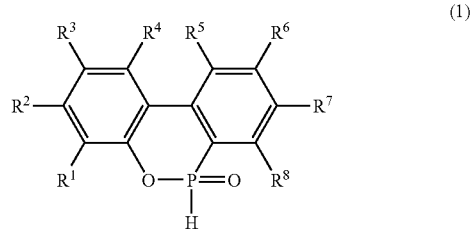

(1)

[formula 2]

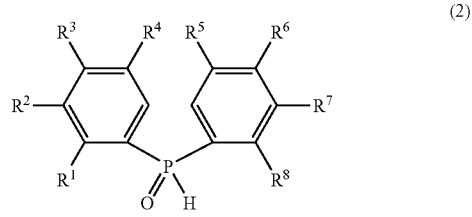

(2)

[formula 3]

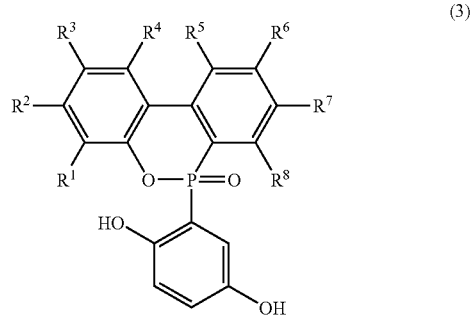

(3)

(in the general formulas (1) to (3), $R^1$, $R^2$, $R^3$, $R^4$, $R^5$, $R^6$, $R^7$, $R^8$ are the same or different, each representing a hydrogen atom, or a monofunctional aliphatic group or aromatic group), and a preferable example of the monofunctional aliphatic group as the substituents $R^1$ to $R^8$ is an alkyl group with a carbon number of 1 to 2, and a preferable example of the monofunctional aromatic group is an aryl group with a carbon number of 6 to 12.

As the substituents $R^1$ to $R^8$, a hydrogen atom, a methyl group, an ethyl group, or a phenyl group is a preferable group, and among them, the hydrogen atom or the phenyl group is especially preferable. Concretely, for instance, the phosphorus compound represented by the general formula (1) is 9,10-dihydro-9-oxa-10-phosphophenanthrene-10-oxide in which the substituents $R^1$ to $R^8$ are all hydrogen atom, the phosphorus compound represented by the general formula (2) is diphenylphosphine oxide in which the substituents $R^1$ to $R^8$ are all hydrogen atoms, and the phosphorus compound represented by the general formula (3) is 10-(2,5-dihydroxyphenyl)-10H-9-oxa-10-phosphophenanthrene-10-oxide in which the substituents $R^1$ to $R^8$ are all hydrogen atoms.

In the present invention, as a raw material of the (B) component, one kind of the aforesaid phosphorus compounds may be singly used, or the combination of a plurality of kinds among them may be used.

Further, as the epoxy resin used here, any well-known epoxy resin may be used without any limitation, provided that it has two or more epoxy groups, and one of or the combination of well-known epoxy resins with an weight per epoxide equivalent of 130 g/eq to 1,500 g/eq may be used, for example: glycidyl ethers, typically, bisphenol A, bisphenol F, bisphenol S, phenol novolak, and ortho-cresol novolak; and glycidyl amines, typically, tetraglycidylamino diphenylmethane and tetraglycidylamino diphenylsulfone. Out of these epoxy resins, one kind may be singly used or the combination of two kinds or more may be used.

(B) the phosphorus-containing epoxy resin is derived by the reaction of the aforesaid phosphorus compound and epoxy resin in predetermined equivalent weight ratios, and it is preferable that a ratio (equivalent weight ratio) of the phosphorus compound represented by any of the aforesaid general formulas (1) to (3) is 0.05 to 0.6 molecules per one epoxy group in the epoxy resin when they are made to react with each other.

The reaction of the phosphorus compound and the epoxy resin may be caused by any of well-known methods, and examples thereof are the reactions using, as a catalyst, a metal oxide, inorganic salts, an organic base salt group, salts thereof, a what is called onium compound, and the like.

The reaction at this time can be caused in the presence of an organic solvent when necessary. The organic solvent usable at this time is not specifically limited, but preferable examples thereof are acetone, methyl ethyl ketone, methyl isobutyl ketone, methanol, ethanol, isopropyl alcohol, n-butanol, methoxypropanol, methyl cellosolve, ethyl cellosolve, ethyl carbitol, ethyl acetate, xylen, toluene, cyclohexanone, N,N-dimethylformamide, and the like.

A phosphorus content ratio of (B) the phosphorus-containing epoxy thermosetting component derived by such a reaction is preferably 1 to 10 mass % in the phosphorus-containing epoxy thermosetting component, and 2 to 5 mass % is especially preferably. Further, an weight per epoxide equivalent of (B) the phosphorus-containing epoxy thermosetting component is preferably 50 g/eq to 800 g/eq. When the phosphorus content ratio and the weight per epoxide equivalent fall within such ranges, it is possible to obtain a photosensitive thermosetting resin composition more excellent in properties such as flame retardancy.

An amount of (B) the phosphorus-containing epoxy thermosetting component blended for 100 parts by mass of (A) the resin component is preferably 1 to 100 parts by mass.

Further, for more improvement in properties such as adhesiveness, chemical resistance, and heat resistance, an epoxy resin curing agent is preferably co-used in (B) the phosphorus-containing epoxy thermosetting component. As such an epoxy resin curing agent, one kind or the mixture of two kinds or more of the following well-known and commonly used curing agents or accelerators is usable, for instance: imidazole derivatives such as 2MZ, 2E4MZ, C11Z, C17Z, 2PZ, 1B2MZ, 2MZ-CN, 2E4MZ-CN, C11Z-CN, 2PZ-CN, 2PHZ-CN, 2MZ-CNS, 2E4MZ-CNS, 2PZ-CNS, 2MZ-AZINE, 2E4MZ-AZINE, C11Z-AZINE, 2MA-OK, 2P4MHZ, 2PHZ, and 2P4BHZ (all of which are the names of products manufactured by Shikoku Chemicals Corporation); guanamines such as acetoguanamine and benzoguanamine; polyamines such as diaminodiphenylmethane, m-phenylenediamine, m-xylenediamine, diaminodiphenylsulfone, dicyandiamide, urea, a urea derivative, melamine, and polybasic hydrazide; organic acid salts and/or epoxy adducts of these; amine complexes of boron trifluoride; triazine derivatives such as ethyl-diamino-S-triazine, 2,4-diamino-S-triazine, and 2,4-di-amino-6-xylyl-S-triazine; tertiary amines such as trimethylamine, triethanolamine, N,N-dimethyl octylamine, N-benzyl dimethylamine, pyridine, N-methylmorpholine, hexa(N-methyl)melamine, 2,4,6-tris(dimethylaminophenol), tetramethylguanidine, and m-aminophenol; polyphenols such as polyvinylphenol, polyvinylphenol bromide, phenol novolak, and alkylphenol novolak; organophosphines such as tributylphosphine, triphenylphosphine, and tris-2-cyanoethyl phosphine; phosphonium salts such as tri-n-butyl (2,5-dihydroxyphenyl)phosphonium bromide and hexadecyl tributyl phosphonium chloride; quaternary ammonium salts such as benzyl trimethyl ammonium chloride and phenyl tributyl ammonium chloride; the aforesaid polybasic acid anhydride; photocation polymerization catalysts such as diphenyliodoniumtetrafluoroborate, triphenyl sulphonium hexafluoroantimonate, 2,4,6-triphenyl thiopyrylium-hexafluorophosphate, IRGACURE 261 (the name of a product manufactured by Ciba-Geigy K.K.), and OPTOMER SP-170 (the name of a product manufactured by Asahidenka Corp.); styrene-maleic anhydride resin; and a product of an equimolar reaction of phenyl isocyanate with dimethylamine or a product of an equimolar reaction of organic polyisocyanate such as tolylene diisocyanate and isophorone diisocyanate with dimethylamine.

Here, an amount of the epoxy resin curing agent blended for 100 parts by mass of (A) the resin component soluble in the dilute alkali solution is preferably 0.01 to 25 parts by mass, and 0.1 to 15 parts by mass is especially preferable.

(C) a photopolymerization initiator used in the present invention is a well-known and commonly used photopolymerization initiator such as an active radical generator generating an active radical when irradiated with an active ray such as an ultraviolet ray, or a sensitizer.

Examples of such an active radical generator are: benzoins such as benzoin, benzoin methyl ether, and benzoin isopropyl ether; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)phenyl]-2-morpholino propane-1-on, and N,N-dimethylamino acetophenone; anthraquinones such as 2-methylanthraquinone, 2-ethylanthraquinone, 2-t-butylanthraquinone, 1-chloroanthraquinone, 2-amylanthraquinone, and 2-aminoanthraquinone; thioxanthones such as 2,4-dimethylthioxanthone, 2,4-diethylthioxanthone, 2-chlorothioxanthone, 2-isopropylthioxanthone, and 2,4-diisopropylthioxanthone; ketals such as acetophenone dimethyl ketal and benzyl dimethyl ketal; benzophenones such as benzophenone, methylbenzophenone, 4,4'-dichlorobenzophenone, 4,4'-bis diethylamino benzophenone, Michler's ketone, and 4-benzoyl-4'-methyldiphenyl sulfide; 2,4,6-trimethyl benzoyl diphenyl phosphine oxide; and the like, among which one kind or the combination of two kinds or more is usable.

Further, as (C) the photopolymerization initiator, usable is one kind or two kinds or more of photosensitizers such as tertiary amines such as N,N-dimethylamino benzoic acid ethyl ester, N,N-dimethylamino benzoic acid isoamyl ester, pentyl-4-dimethylaminobenzoate, triethylamine, and triethanolamine.

When a plurality of kinds of them are combined for use as (C) the photopolymerization initiator, an example of a preferable combination is the combination of 2-methyl-1-[4-(methylthio)phenyl]-2-morpholino propane-1-on (manufactured by Ciba-Geigy K.K., product name: IRGACURE 907) with 2,4-diethylthioxanthone (manufactured by Nippon Kayaku Co., Ltd., product name: KAYACURE-DETX), 2-isopropylthioxanthone, or 4-benzoyl-4'-methyldiphenyl sulfide.

Here, an amount of (C) the photopolymerization initiator blended for 100 parts by mass of (A) the resin component soluble in the dilute alkali solution is preferably within a range of 1 to 50 parts by mass.

As (D) an organophosphorus compound other than the aforesaid (B) component, usable is a well-known organophosphorus compound used for giving flame retardancy, and examples thereof are organophosphorus compounds such as a phosphazene compound, a phosphoric acid melamine compound, and a biphenyl phosphate compound.

Examples of the phosphazene compound include phosphazene oligomers represented by the following general formulas (4), (5),

[formula 4]

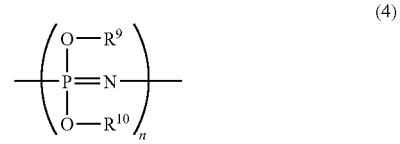

[formula 5]

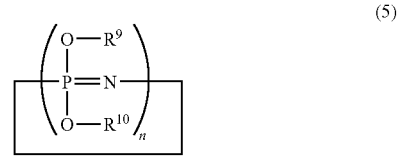

(in the formulas, $R^9$ and $R^{10}$ each are a monovalent organic group not containing a hydrogen atom or halogen, and n is an integer from 3 to 10), and here, preferable groups as the monovalent organic group as $R^9$ and $R^{10}$ are a phenyl group, an alkyl group, an amino group, an allyl group, and the like. Further, examples of a terminal group of the general formula (4) include a hydrogen atom, a hydroxyl group, an alkyl group, an alkoxyl group, an aryloxy group, a cyanate group, and the like.

More preferable phosphazene compounds are phosphazen oligomers such as a propoxyphosphazene oligomer, a phenoxyphosphazene oligomer, a cyanate phenylphosphazene oligomer, and a cyanophenoxy phosphaze oligomer.

Further, an example of the phosphoric acid melamine compound includes a phosphoric acid melamine compound represented by the following general formula (6),

[formula 6]

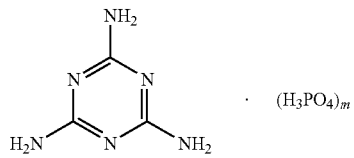

(6)

(in the formula, m is 1 to 10). In the above, phosphoric acid and melamine exist in a salt state.

Further, examples of the phosphinate include phosphinate represented by the following general formula (7) or (8),

[formula 7]

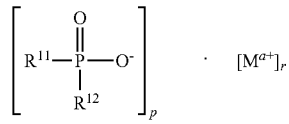

(7)

(in the formula, $R^{11}$ and $R^{12}$ are the same or different, each being an alkyl group which is straight- or branch-chained with a carbon number of 1 to 6 or an aryl group with a carbon number of 6 to 12, $M^{q+}$ is at least one ion selected from ionized Mg, Ca, Al, Sb, Sn, Ge, Ti, Zn, Fe, Zr, Ce, Bi, Sr, Mn, Li, Na, and K and a protonated nitrogenous base, p is 1 to 4, q is 1 to 4, r is 1 to 4, and p=q×r is satisfied),

[formula 8]

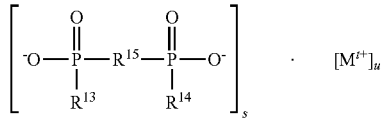

(8)

(in the formula, $R^{13}$ and $R^{14}$ are the same or different, each being an alkyl group which is straight- or branch-chained with a carbon number of 1 to 6 or an aryl group with a carbon number of 6 to 12, $R^{15}$ is an alkylene group which is straight- or branch-chained with a carbon number of 1 to 10, an arylene group with a carbon number of 6 to 10, an alkylarylene group with a carbon number of 6 to 10, or an arylalkylene group with a carbon number of 6 to 10, $M^{t+}$ is at least one ion selected from ionized Mg, Ca, Al, Sb, Sn, Ge, Ti, Zn, Fe, Zr, Ce, Bi, Sr, Mn, Li, Na, and K and a protonated nitrogenous base, s is 1 to 4, t is 1 to 4, u is 1 to 4, and 2×s=t×u is satisfied). Examples of the protonated nitrogenous base named as $M^{q+}$ and $M^{t+}$ are protonated nitrogenous bases such as ammonia, melamine, and triethanolamine, and in particular, ammonium ion ($NH_4^+$) is preferable.

Here, as for $R^{11}$ to $R^{14}$, examples of the alkyl group include a methyl group, an ethyl group, a n-propyl group, an isopropyl group, a n-butyl group, a tertiary butyl group, and a n-pentyl group, and an example of the aryl group includes a phenyl group. Further, as for $R^{15}$, examples of the alkylene group include a methylene group, an ethylene group, a n-propylene group, an isopropylene group, a n-butylene group, a tertiary butylene group, a n-pentylene group, a n-octylene group, a n-dodecylene group, and the like, examples of the arylene group include a phenylene group and a naphthylene group, examples of the alkylarylene group include a methylphenylene group, an ethylphenylene group, a tert-butyl phenylene group, a methylnaphthylene group, an ethylnaphthylene group, a tert-butyl-naphthylene group, and the like, and examples of the arylalkylene group include a phenylmethylene group, a phenylethylene group, a phenylpropylene group, a phenylbutylene group, and the like.

Further, an example of the other organophosphorus compound is phosphinoyl propionic acid represented by the following general formula (9).

[formula 9]

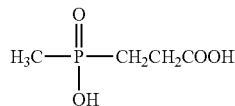

(9)

Out of these (D) organophosphorus compounds, one kind or the mixture of two or more kinds is usable. When the mixture of two or more kinds is used, the mixture preferably contains the phosphazene compound, and in addition, contains at least one kind selected from the phosphoric acid melamine compound, the phosphinate, and the phosphinoyl propionic acid.

Further, in view of heat resistance, moisture resistance, flame retardancy, chemical resistance, and the like, a phosphazene compound whose melting point is 70° C. or higher is preferably usable. As this phosphazene compound, one kind or the mixture of two kinds or more is also usable.

An amount of (D) the organophosphorus compound blended for 100 parts by mass of (A) the resin component soluble in the dilute alkali solution is preferably 1 to 50 parts by mass, and 1 to 30 parts by mass is especially preferable.

As (E) the diluent used in the present invention, an organic solvent and/or a photopolymerizable monomer is usable, and examples of the organic solvent are: ketones such as ethylmethylketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; alcohols such as ethanol, propanol, ethylene glycol, and propylene glycol; aliphatic hydrocarbons such as octane and decane; petroleum solvents such as petroleum ether, petroleum naphtha, hydrogenated petroleum naphtha, and solvent naphtha; and the like.

Examples of the photopolymerizable monomer are: hydroxy alkyl(meth)acrylates such as 2-hydroxyethyl(meth)acrylate and 2-hydroxypropyl(meth)acrylate; mono- or di-(meth)acrylates of glycols such as ethylene glycol, methoxy tetraethylene glycol, and polyethylene glycol; (meth)acrylamides such as N,N-dimethyl(meth)acrylamide and N-methylol(meth)acrylamide; aminoalkyl(meth)acrylates such as N,N-dimethylamino ethyl(meth)acrylate; polyhydric alcohols such as hexanediol, trimethylolpropane, pentaerythritol, ditrimethylolpropane, dipentaerythritol, and tris-hydroxyethyl isocyanurate; polyvalent(meth)acrylates of ethylene oxide or propylene oxide adducts of the above; polyvalent (meth)acrylates of ethylene oxide or propylene oxide adducts of phenols, such as phenoxy ethyl(meth)acrylate and polyethoxy di(meth)acrylate of bisphenol A; (meth)acrylates of glycidyl ethers such as glycerine diglycidyl ether, trimethylolpropane triglycidyl ether, and triglycidyl isocyanurate; ε-caprolactone modified (meth)acrylates such as caprolactone modified tris(acryloxyethyl) isocyanate; melamine (meth)acrylate; and the like. One kind or the mixture of two kinds or more is usable as the (E) diluent.

An amount of (E) the diluent blended for 100 parts by mass of (A) the resin component soluble in the dilute alkali solution is preferably 1 to 100 parts by mass, and 10 to 80 parts by mass is especially preferable.

A purpose of using the diluent is, if it is the photopolymerizable monomer, to dilute (A) the resin component soluble in the dilute alkali solution, thereby adjusting the viscosity thereof to an easily applicable state and to increase photopolymerizability, and, if it is the organic solvent, to dissolve and dilute (A) the resin component soluble in the dilute alkali solution, thereby adjusting the viscosity thereof to an easily applicable state and applying it in liquid form followed by the drying to form a film. Therefore, according to the kind of the diluent used, one exposure method out of a contact type which brings a photomask into contact with a coating film and a non-contact type is selected.

Further, in the present invention, (F) a phosphorus-containing photopolymerizable monomer component other than the aforesaid (B), (D), and (E) components has in its molecule a phosphorus atom giving flame retardancy and a (meth)acryloyl group which is a radical photopolymerizable group, and the phosphorus atom is taken into matrix of a cured product at the time of the photopolymerization. Therefore, it is possible to give flame retardancy without impairing plasticity and heat resistance.

(F) the phosphorus-containing photopolymerizable monomer used in the present invention can be derived by a Michael-addition reaction of a phosphorus compound such as diethyl phosphite, di-n-propyl phosphite, dibutyl phosphite, dihexyl phosphite, diethyl phosphine oxide, di-n-propyl phosphine oxide, di-n-butyl phosphine oxide, and dihexyl phosphine oxide with a (meth)acryloyl group of a (meth)acryl compound.

Here, preferable phosphorus compounds in view of flame retardancy and stability of the compound are phosphorus compounds represented by the following general formulas (1) to (3),

[formula 10]

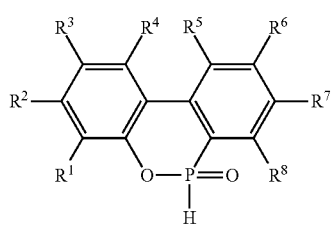

(1)

[formula 11]

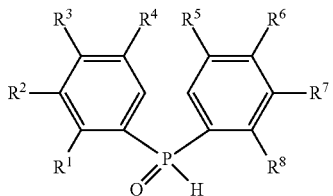

(2)

[formula 12]

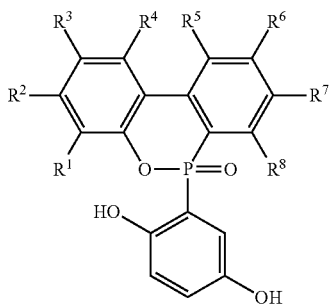

(3)

(in the general formulas (1) to (3), $R^1$, $R^2$, $R^3$, $R^4$, $R^5$, $R^6$, $R^7$, $R^8$ are the same or different, each representing a hydrogen atom, or a monofunctional aliphatic group or aromatic group).

In the phosphorus compound represented by the general formula (1), (2), or (3) in (F) the phosphorus-containing photopolymerizable monomer component used in the present invention, as for the substituents $R^1$ to $R^8$, an alkyl group with a carbon number of 1 to 2 is preferable as the monofunctional aliphatic group, and an aryl group with a carbon number of 6 to 12 is preferable as the monofunctional aromatic group.

As the substituents $R^1$ to $R^8$, a hydrogen atom, a methyl group, an ethyl group, and a phenyl group are preferable groups, and among them, the hydrogen atom and the phenyl group are especially preferable. Concretely, an example of the phosphorus compound represented by the general formula (1) is 9,10-dihydro-9-oxa-10-phospha-phenanthrene-10-oxide in which the substituents $R^1$ to $R^8$ are all hydrogen atoms; an example of the phosphorus compound represented by the general formula (2) is diphenylphosphine oxide in which the substituents $R^1$ to $R^8$ are all hydrogen atoms; and an example of the phosphorus compound represented by the general formula (3) is 10-(2,5-dihydroxyphenyl)-10H-9-oxa-10-phospha-phenanthrene-10-oxide in which the substituents $R^1$ to $R^8$ are all hydrogen atoms. These compounds are available on the market, and for example, 9,10-dihydro-9-oxa-10-phospha-phenanthrene-10-oxide is available from Sankyo Co., Ltd. (product name: HCA).

Further, as the (meth)acryl compound used as the raw material in order to obtain the phosphorus-containing (meth)acryl compound, a polyfunctional (meth)acryl compound having at least three or more (meth)acryloyl groups in one molecule is preferably used in view of curability. Possible concrete examples of such a compound are trimethylolpropane tri(meth)acrylate, tri(meth)acrylate of a trimethylolpropane ethylene oxide adduct, tri(meth)acrylate of a trimethylolpropane propylene oxide adduct, pentaerythritol tri(meth)acrylate, pentaerythritol tetra(meth)acrylate, tetra(meth)acrylate of a pentaerythritol ethylene oxide adduct, tetra(meth)acrylate of a pentaerythritol propylene oxide adduct, dipentaerythritol hexa(meth)acrylate, tris(2-acryloyloxy ethyl)isocyanurate, and the like, and in view of flame retardancy and water resistance, trimethylolpropane(meth)acrylate, pentaerythritol tetra(meth)acrylate, tris(2-acryloyloxy ethyl) isocyanurate, and caprolacton-modified dipentaerythritol hexa(meth)acrylate are especially preferable.

An amount of the phosphorus compound added to each of these polyfunctional (meth)acryl compounds is suitably within a range of 0.1 to 0.7 equivalent weight per one equivalent weight of (meth)acryloyl group, and is preferably 0.2 to 0.5 equivalent weight. If it is less than 0.1 equivalent weight, sufficient flame retardancy cannot be obtained, and if it is over 0.7 equivalent weight, heat resistance is lowered.

As the reaction of the aforesaid polyfunctional (meth)acryl compound and phosphorus-containing compound, a generally used method is usable, and it is only necessary to heat the both while they are stirred and mixed in a reaction vessel, and no specially catalyst is necessary. The reaction progresses while dry air is blown in, the temperature is 50 to 180° C., preferably, 100 to 130° C., and the reaction time is preferably 0.5 to 50 hours. If the temperature is too low, the reaction progresses slowly to consume time, and when the temperature is too high, the polymerization reaction of the (meth)acryl group progresses, resulting in the production of a gelled substance. A solvent need not be used at the time of the reaction, but if a solvent maybe used, a solvent inactive to the reaction may be selected according to solubility of the raw materials and the reaction temperature.

A phosphorus content of thus obtained phosphorus-containing (meth)acryl compound is preferably 1 to 8 mass %, more preferably 2 to 6 mass %. If it is less than 1 mass %, sufficient flame retardancy is not exhibited, and if it is over 8 mass %, compatibility of the other resin component lowers or the viscosity becomes too high, lowering workability in handling. As (F) the phosphorus-containing photopolymerizable monomer, one kind or the mixture of two kinds or more may be used.

(F) the phosphorus-containing photopolymerizable monomer used in the present invention forms a C—P bond stable to hydrolysis by the Michael-addition reaction and thus has higher hydrolysis resistance than that of a phosphoric acid ester-based flame retardant which is a generally used flame retardant, and when combined with phosphazene and phosphorus-containing epoxy resin, it is suitably usable in the application such as a printed circuit board requiring electric insulation.

An amount of (F) the phosphorus-containing photopolymerizable monomer used is preferably 1 to 50 mass % in the radical polymerizable flame retardant resin component of the present invention, more preferably, 5 to 25 mass %. If the amount is less than 1 mass %, flame retardancy lowers, and if it is over 50 mass %, resolution and heat resistance lower.

In the photosensitive thermosetting resin composition of the present invention, well-known and commonly used inorganic fillers such as barium sulfate, barium titanate, silicon oxide powder, finely powdered silicon oxide, amorphous silica, talc, clay, magnesium carbonate, calcium carbonate, aluminum oxide, aluminum hydroxide, and mica powder are usable besides the above-described components when necessary, in order to improve properties such as adhesiveness and hardness.

An amount of the inorganic filler used is preferably 0 to 60 mass % in the whole photosensitive thermosetting resin composition of the present invention, more preferably, 5 to 40 mass %.

Further, when necessary, usable are: a well-known and commonly used colorant such as phthalocyanine blue, phthalocyanine green, iodine green, disazo yellow, crystal violet, titanium oxide, carbon black, or naphthalene black; a well-known and commonly used polymerization inhibitor such as hydroquinone, hydroquinone monomethyl ether, t-butylcatecole, pyrogallol, or phenothiazine; a well-known and commonly used thickener such as asbestos, orbene, bentone, or monmorillonite; and well-known and commonly used additives such as a silicone-based, fluorine-based, or polymer-based defoamer, a leveling agent, and an imidazole-based, thiazole-based, or triazole-based silane coupling agent.

As long as various properties as a solder resist are not affected, the following substances are further usable: well-known and commonly used binder resin such as polyester resin which is synthesized from a copolymer of ethylenically unsaturated compounds such as acrylic ester or polyhydric alcohol with a polybasic acid compound; a photopolymerizable oligomer such as polyester(meth)acrylate, polyurethane (meth)acrylate, or epoxy(meth)acrylate.

The photosensitive thermosetting resin composition of the present invention can be manufactured by adding and blending other components when necessary in addition to the above-described (A) to (F) components and thereafter uniformly mixing them by a three-roll mill or the like.

Further, a flexible printed circuit board of the present invention can also be manufactured by a common method in such a manner that a flexible copper-clad laminate is manufactured by a common method of applying the photosensitive thermosetting resin composition of the present invention in a varnish form on a flexible printed circuit board on which a copper foil is bonded on one surface or both surfaces of a polyimide film by heat rolling and a wiring pattern is formed, and thereafter curing the photosensitive thermosetting resin by heating, and when necessary, the flexible copper-clad laminate is subjected to boring and through-hole plating, and is molded by hot pressing with a cover lay with holes at predetermined places being laid over it.

Further, a flexible printed circuit board with a reinforcing plate can be manufactured by a common method of stacking a reinforcing plate on the flexible printed circuit board via the thermosetting resin composition and performing hot pressing.

Further, a multilayer flexible printed circuit board can be manufactured by a common method in which a flexible copper-clad laminate or the like is stacked on the flexible printed circuit board of the present invention via the thermosetting resin composition, the resultant workpiece is molded by hot pressing, through holes are formed therein, and through-hole plating is performed, and thereafter, a predetermined circuit is formed.

EXAMPLES

Next, the present invention will be described by using examples and comparative examples. Blended amounts of components used in the examples and the comparative examples are shown in Tables 1 to 3.

Synthesis Example 1

Synthesis of Phosphorus-Containing Epoxy Thermosetting Component

An aqueous solution of 0.5 g tetramethylammonium chloride was used as a reaction catalyst, 453.5 g EPICLON 830 (name of a product manufactured by Dainippon Ink and Chemicals Incorporated; weight per epoxide equivalent 185 g/eq) which is bisphenol F diglycidyl ether was used as the epoxy resin, and 104.5 g 10-(2,5-dihydroxyphenyl)-10H-9-oxa-10-phosphophenanthrene-10-oxide (manufactured by Sanko Chemical Industry Co., Ltd., product name: HCA-HQ; molecular weight 324.3) was used as the phosphorus compound, and the both were made to react with each other in ethanol at 100 to 180° C. temperature for five hours, whereby a phosphorus-containing epoxy resin with a 2.0% phosphorus content was obtained. At this time, an equivalent weight ratio of HCA-HQ and an epoxy group which were the raw materials was 0.140/1, and an weight per epoxide equivalent of the obtained phosphorus-containing epoxy resin was 300 g/eq.

Synthesis Example 2

Synthesis of Phosphorus-Containing Photopolymerizable Monomer 162 parts by mass (0.75 mol) 9,10-dihydro-9-oxa-10-phosphophenanthrene-10-oxide (manufactured by Sanko Chemical Industry Co., Ltd., product name: HCA) was added to 338 parts by mass (1 mol) trimethylolpropane triacrylate (manufactured by Daicel-Cytec Co., Ltd., product name: TMPTA), and they were made to react with each other at 130° for 15 hours while air was blown thereto, whereby a phosphorus-containing photopolymerizable monomer with a phosphorus content ratio of 4.6 mass % was obtained. At this time, an equivalent weight ratio of the phosphorus compound and an acryloyl group of the acrylate which were the raw materials was 0.31/1.

Reference Example 1

80 parts by mass KAYARAD ZFR1122 (name of a product manufactured by Nippon Kayaku Co., Ltd.) which was used as the epoxy acrylate compound, 20 parts by mass KAYARAD DPHA (name of a product manufactured by Nippon Kayaku Co., Ltd.) being a photopolymerizable monomer which was used as the diluent, 7 parts by mass IRGACURE 907 (name of a product manufactured by Ciba-Geigy K.K., a photopolymerization initiator 1) and 3 parts by mass KAYACURE DETX-S (name of a product manufactured by Nippon Kayaku Co., Ltd., a photopolymerization initiator 2) which were used as the photopolymerization initiators, 20 parts by mass phosphorus-containing epoxy resin obtained in the synthesis example which was used as the phosphorus-containing epoxy thermosetting component, 2 parts by mass imidazole-based polymerization catalyst (manufactured by Shikoku Chemicals Corporation, product name: 2E4MZ) and 2 parts by mass melamine which were used as the curing agents, 10 parts by mass barium sulfate (manufactured by Sakai Chemicals Corporation, product name: B-30), 2 parts by mass phthalocyanine green, 5 parts by mass finely powdered silica (manufactured by Nippon Aerosil Co., Ltd, product name: AEROSIL R972), and 5 parts by mass phenoxy phosphazene oligomer (melting point: 110° C.) which was used as the phosphazene compound were blended and knead by a three-roll mill, whereby a photosensitive thermosetting resin composition was manufactured.

Reference Example 2

A photosensitive thermosetting resin composition was manufactured with the same composition and operation as in Reference Example 1, except that 3 parts by mass phenoxy-phosphazene oligomer (melting point: 110° C.) was used as the phosphazene compound and 1 part by mass pyrophosphoric melamine (manufactured by Mitsui Fine Chemicals Inc., thermal decomposition temperature: 310° C.) was used as the organophosphorus compound.

Reference Example 3

A photosensitive thermosetting resin composition was manufactured with the same composition and operation as in Reference Example 1, except that 3 parts by mass phenoxy-phosphazene oligomer (melting point: 110° C.) was used as the phosphazene compound and 1 part by mass phosphinate (manufactured by Clariant corporation, product name: OP935, thermal decomposition temperature: 300° C.) was used as the organophosphorus compound.

Reference Example 4

A photosensitive thermosetting resin composition was manufactured with the same composition and operation as in Reference Example 1, except that 3 parts by mass phenoxy-phosphazene oligomer (melting point: 110° C.) was used as the phosphazene compound and 1 part by mass phosphinoyl propionic acid (manufactured by Nippon Chemical Industrial Co., Ltd., product name: MPPA, melting point: 118° C.) was used as the organophosphorus compound.

Reference Example 5

A photosensitive thermosetting resin composition was manufactured with the same composition and operation as in Reference Example 1, except that 1 part by mass phenoxy-phosphazene oligomer (melting point: 110° C.) and 2 parts by mass cyanophenoxy phosphazene (manufactured by Fushimi Pharmaceutical Co., Ltd., product name: FP-300; melting point: 121° C.) were used as the phosphazene compounds, and 1 part by mass phosphinate (manufactured by Clariant corporation, product name: OP935, thermal decomposition temperature: 300° C.) was used as the organophosphorus compound.

Example 6

A photosensitive thermosetting resin composition was manufactured with the same composition and operation as in Reference Example 1, except that 1 part by mass phenoxy-phosphazene oligomer (melting point: 110° C.) and 2 parts by mass cyanate phenoxy phosphazene (manufactured by Fushimi Pharmaceutical Co., Ltd., product name: FP-500; melting point: 105° C.) were used as the phosphazene compounds, and 1 part by mass phosphinate (manufactured by Clariant corporation, product name: OP935, thermal decomposition temperature: 300° C.) was used as the organophosphorus compound.

Example 7

A photosensitive thermosetting resin composition was manufactured with the same composition and operation as in Reference Example 1, except that 2 parts by mass cyanophenoxy phosphazene (manufactured by Fushimi Pharmaceutical Co., Ltd., product name: FP-300; melting point: 121° C.) was used as the phosphazene compound, and 2 parts by mass phosphinate (manufactured by Clariant corporation, product name: OP935, thermal decomposition temperature: 300° C.) was used as the organophosphorus compound.

Example 8

A photosensitive thermosetting resin composition was manufactured with the same composition and operation as in Reference Example 1, except that 2 parts by mass cyanate phenoxy phosphazene (manufactured by Fushimi Pharmaceutical Co., Ltd., product name: FP-500; melting point: 105° C.) was used as the phosphazene compound, and 2 parts by mass phosphinoyl propionic acid (manufactured by Nippon Chemical Industrial Co., Ltd., product name: MPPA, melting point: 118° C.) was used as the organophosphorus compound.

Reference Example 9

80 parts by mass KAYARAD ZFR1122 (name of a product manufactured by Nippon Kayaku Co., Ltd.) which was used as the epoxy acrylate compound, 20 parts by mass KAYARAD DPHA (name of a product manufactured by Nippon Kayaku Co., Ltd.) being a photopolymerizable monomer which was used as the diluent, 7 parts by mass IRGACURE 907 (name of a product manufactured by Ciba-Geigy K.K., a photopolymerization initiator 1) and 3 parts by mass KAYACURE DETX-S (name of a product manufactured by Nippon Kayaku Co., Ltd., a photopolymerization initiator 2) which were used as the photopolymerization initiators, 20 parts by mass phosphorus-containing epoxy resin obtained in the synthesis example 1 which was used as the phosphorus-containing epoxy thermosetting component, 2 parts by mass imidazole-based polymerization catalyst (manufactured by Shikoku Chemicals Corporation, product name: 2E4MZ) and 2 parts by mass melamine which were used as curing agents, 10 parts by mass phosphorus-containing photopolymerizable monomer obtained in the aforesaid synthesis example 2, 10 parts by mass barium sulfate (manufactured by Sakai Chemicals Corporation, product name: B-30), 2 parts by mass of phthalocyanine green, and 5 parts by mass finely powdered silica (manufactured by Nippon Aerosil Co., Ltd, product name: AEROSIL R972), and 5 parts by mass phenoxyphosphazene oligomer (melting point: 110° C.) were blended and knead by a three-roll mill, whereby a photosensitive thermosetting resin composition was manufactured.

Reference Example 10

A photosensitive thermosetting resin composition was manufactured with the same composition and operation as in Reference Example 9, except that 3 parts by mass phenoxyphosphazene oligomer (melting point: 110° C.) was used as the phosphazene compound and 1 part by mass pyrophosphoric melamine (manufactured by Mitsui Fine Chemicals Inc., thermal decomposition temperature: 310° C.) was used as the organophosphorus compound.

Reference Example 11

A photosensitive thermosetting resin composition was manufactured with the same composition and operation as in Reference Example 9, except that 3 parts by mass phenoxyphosphazene oligomer (melting point: 110° C.) was used as the phosphazene compound and 1 part by mass phosphinate (manufactured by Clariant corporation, product name: OP935, thermal decomposition temperature: 300° C.) was used as the organophosphorus compound.

Reference Example 12

A photosensitive thermosetting resin composition was manufactured with the same composition and operation as in Reference Example 9, except that 3 parts by mass phenoxyphosphazene oligomer (melting point: 110° C.) was used as the phosphazene compound and 1 part by mass phosphinoyl propionic acid (manufactured by Nippon Chemical Industrial Co., Ltd., product name: MPPA, melting point: 118° C.) was used as the organophosphorus compound.

Example 13

A photosensitive thermosetting resin composition was manufactured with the same composition and operation as in Reference Example 9, except that 1 part by mass phenoxyphosphazene oligomer (melting point: 110° C.) and 2 parts by mass cyanophenoxy phosphazene (manufactured by Fushimi Pharmaceutical Co., Ltd., product name: FP-300; melting point: 121° C.) were used as the phosphazene compounds, and 1 part by mass phosphinate (manufactured by Clariant corporation, product name: OP935, thermal decomposition temperature: 300° C.) was used as the organophosphorus compound.

Example 14

A photosensitive thermosetting resin composition was manufactured with the same composition and operation as in Reference Example 9, except that 1 part by mass phenoxyphosphazene oligomer (melting point: 110° C.) and 2 parts by mass cyanate phenoxy phosphazene (manufactured by Fushimi Pharmaceutical Co., Ltd., product name: FP-500; melting point: 105° C.) were used as the phosphazene compounds, and 1 part by mass phosphinate (manufactured by Clariant corporation, product name: OP935, thermal decomposition temperature: 300° C.) was used as the organophosphorus compound.

Example 15

A photosensitive thermosetting resin composition was manufactured with the same composition and operation as in Reference Example 9, except that 2 parts by mass cyanophenoxy phosphazene (manufactured by Fushimi Pharmaceutical Co., Ltd., product name: FP-300; melting point: 121° C.) was used as the phosphazene compound, and 2 parts by mass phosphinate (manufactured by Clariant corporation, product name: OP935, thermal decomposition temperature: 300° C.) was used as the organophosphorus compound.

Example 16

A photosensitive thermosetting resin composition was manufactured with the same composition and operation as in Reference Example 9, except that 2 parts by mass cyanate phenoxy phosphazene (manufactured by Fushimi Pharmaceutical Co., Ltd., product name: FP-500; melting point: 105° C.) was used as the phosphazene compound, and 2 parts by mass phosphinoyl propionic acid (manufactured by Nippon Chemical Industrial Co., Ltd., product name: MPPA, melting point: 118° C.) was used as the organophosphorus compound.

TABLE 1

| | Example | | | | | | | |
|---|---|---|---|---|---|---|---|---|
| | 1 | 2 | 3 | 4 | 5 | 6 | 7 | 8 |
| epoxy acrylate compound | 80 | 80 | 80 | 80 | 80 | 80 | 80 | 80 |
| phosphorus-containing photopolymerizable monomer | — | — | — | — | — | — | — | — |
| photopolymerizable monomer | 20 | 20 | 20 | 20 | 20 | 20 | 20 | 20 |
| photopolymerization initiator 1 | 7 | 7 | 7 | 7 | 7 | 7 | 7 | 7 |
| photopolymerization initiator 2 | 3 | 3 | 3 | 3 | 3 | 3 | 3 | 3 |
| phosphorus-containing epoxy resin | 20 | 20 | 20 | 20 | 20 | 20 | 20 | 20 |
| biphenyl epoxy resin | — | — | — | — | — | — | — | — |
| brominated epoxy resin | — | — | — | — | — | — | — | — |
| curing agent (imidazole based) | 2 | 2 | 2 | 2 | 2 | 2 | 2 | 2 |
| curing agent (melamine) | 2 | 2 | 2 | 2 | 2 | 2 | 2 | 2 |
| barium sulfate | 10 | 10 | 10 | 10 | 10 | 10 | 10 | 10 |
| pigment | 2 | 2 | 2 | 2 | 2 | 2 | 2 | 2 |
| finely powdered silica | 5 | 5 | 5 | 5 | 5 | 5 | 5 | 5 |
| phenoxyphosphazene oligomer | 5 | 3 | 3 | 3 | 1 | 1 | — | — |
| cyanophenoxy phosphazene | — | — | — | — | 2 | — | 2 | — |
| cyanate phenoxy phosphazene | — | — | — | — | — | 2 | — | 2 |
| pyrophosphoric melamine | — | 1 | — | — | — | — | — | — |
| phosphinate | — | — | 1 | — | 1 | 1 | 2 | — |
| phosphinoyl propionic acid | — | — | — | 1 | — | — | — | 2 |
| bromine-based flame retardant | — | — | — | — | — | — | — | — |

TABLE 2

| | Example | | | | | | | |
|---|---|---|---|---|---|---|---|---|
| | 9 | 10 | 11 | 12 | 13 | 14 | 15 | 16 |
| epoxy acrylate compound | 80 | 80 | 80 | 80 | 80 | 80 | 80 | 80 |
| phosphorus-containing photopolymerizable monomer | 10 | 10 | 10 | 10 | 10 | 10 | 10 | 10 |
| photopolymerizable monomer | 10 | 10 | 10 | 10 | 10 | 10 | 10 | 10 |
| photopolymerization initiator 1 | 7 | 7 | 7 | 7 | 7 | 7 | 7 | 7 |
| photopolymerization initiator 2 | 3 | 3 | 3 | 3 | 3 | 3 | 3 | 3 |
| phosphorus-containing epoxy resin | 20 | 20 | 20 | 20 | 20 | 20 | 20 | 20 |
| biphenyl epoxy resin | — | — | — | — | — | — | — | — |
| brominated epoxy resin | — | — | — | — | — | — | — | — |
| curing agent (imidazole based) | 2 | 2 | 2 | 2 | 2 | 2 | 2 | 2 |
| curing agent (melamine) | 2 | 2 | 2 | 2 | 2 | 2 | 2 | 2 |
| barium sulfate | 10 | 10 | 10 | 10 | 10 | 10 | 10 | 10 |
| pigment | 2 | 2 | 2 | 2 | 2 | 2 | 2 | 2 |
| finely powdered silica | 5 | 5 | 5 | 5 | 5 | 5 | 5 | 5 |
| phenoxyphosphazene oligomer | 5 | 3 | 3 | 3 | 1 | 1 | — | — |
| cyanophenoxy phosphazene | — | — | — | — | 2 | — | 2 | — |
| cyanate phenoxy phosphazene | — | — | — | — | — | 2 | — | 2 |
| pyrophosphoric melamine | — | 1 | — | — | — | — | — | — |
| phosphinate | — | — | 1 | — | 1 | 1 | 2 | — |
| phosphinoyl propionic acid | — | — | — | 1 | — | — | — | 2 |
| bromine-based flame retardant | — | — | — | — | — | — | — | — |

Comparative Example 1

A photosensitive thermosetting resin composition not containing an organophosphorus compound was manufactured with the same composition and operation as in Example 1, except that the phosphazene oligomer was not blended and 20 parts by mass brominated epoxy resin (manufactured by Dainippon Ink and Chemicals Incorporated, product name: EPICRON 1121) having flame retardancy was used instead of the phosphorus-containing epoxy resin.

Comparative Example 2

A photosensitive thermosetting resin composition not containing an organophosphorus compound was manufactured with the same composition and operation as in Example 1, except that 5 parts by mass tetrabromobisphenol A (manufactured by Teijin Chemicals Ltd., product name: FIREGUARD) which is a bromine-based flame retardant was used as the flame retardant instead of the phosphazene oligomer, and 20 parts by mass biphenyl epoxy (manufactured by Japan Epoxy Resins Co., Ltd., product name: EPICOAT YX4000) was used instead of the phosphorus-containing epoxy resin.

Comparative Example 3

A photosensitive thermosetting resin composition was manufactured with the same composition and operation as in Example 1, except that 20 parts by mass biphenyl epoxy resin (manufactured by Japan Epoxy Resins Co., Ltd., product name: EPICOAT YX4000) was used instead of the phosphorus-containing epoxy resin.

Comparative Example 4

A photosensitive thermosetting resin composition was manufactured with the same composition and operation as in Example 9, except that neither the phosphazene oligomer nor the phosphorus-containing photopolymerizable monomer was blended, and 20 parts by mass biphenyl epoxy resin (manufactured by Japan Epoxy Resins Co., Ltd., product name: EPICOAT YX4000) was used instead of the phosphorus-containing epoxy resin.

Comparative Example 5

A photosensitive thermosetting resin composition was manufactured with the same composition and operation as in Example 9, except that the phosphazene oligomer was not blended.

TABLE 3

| | Comparative Example | | | | |
|---|---|---|---|---|---|
| | 1 | 2 | 3 | 4 | 5 |
| epoxy acrylate compound | 80 | 80 | 80 | 80 | 80 |
| phosphorus-containing photopolymerizable monomer | — | — | — | 10 | 10 |
| photopolymerizable monomer | 20 | 20 | 20 | 10 | 10 |
| photopolymerization initiator 1 | 7 | 7 | 7 | 7 | 7 |
| photopolymerization initiator 2 | 3 | 3 | 3 | 3 | 3 |
| phosphorus-containing epoxy resin | — | — | — | — | 20 |
| biphenyl epoxy resin | — | 20 | 20 | 20 | — |
| brominated epoxy resin | 20 | — | — | — | — |
| curing agent (imidazole based) | 2 | 2 | 2 | 2 | 2 |
| curing agent (melamine) | 2 | 2 | 2 | 2 | 2 |
| barium sulfate | 10 | 10 | 10 | 10 | 10 |
| pigment | 2 | 2 | 2 | 2 | 2 |
| finely powdered silica | 5 | 5 | 5 | 5 | 5 |
| phenoxyphosphazene oligomer | — | — | 5 | — | — |
| cyanophenoxy phosphazene | — | — | — | — | — |
| cyanate phenoxy phosphazene | — | — | — | — | — |
| pyrophosphoric melamine | — | — | — | — | — |
| phosphinate | — | — | — | — | — |
| phosphinoyl propionic acid | — | — | — | — | — |
| bromine-based flame retardant | — | 5 | — | — | — |

Test Example

The resin compositions obtained in the examples and the comparative examples were applied on the whole surfaces of copper-clad polyimide film substrates (copper thickness 18 μm/polyimide film thickness 25 μm) on which patterns were formed, up to a 20 to 30 μm thickness, by a screen printer using a 150 mesh polyester screen, and each coating film was dried for 30 minutes by an 80° C. hot air drier. Next, a negative film of a resist pattern was brought into contact with each of the coating films and was irradiated with an ultraviolet ray by using an ultraviolet irradiation/exposure unit (exposure amount 400 mJ/cm$^2$). Thereafter, the films were developed at 1 kgf/cm$^2$ for one minute by a spray using a sodium carbonate aqueous solution with a 1 mass % concentration, and were further thermally cured under the condition of 150° C.×60 minutes after unexposed portions were dissolved and removed, whereby cured films were obtained.

Regarding these cured films, flame retardancy, insulation resistance, a gas generation amount during the combustion, adhesiveness, pencil hardness, resolution, soldering heat resistance, chemical resistance, and folding endurance were measured by the following methods and evaluated based on the ratings shown below, and Tables 4 to 6 show the results.

[flame retardancy test] The test was conducted according to the UL94 flame retardancy test.

[insulation resistance] The test was conducted according to IEC-PB112.

[analysis of combustion gas] Samples were burned in the air at 750° C. for ten minutes, gas generated at this time was absorbed by water as an absorption liquid and was analyzed by an ion chromatography, and the concentration of hydrogen bromide in 100 g of the generated gas was calculated.

[adhesiveness] According to JIS D 0202, test pieces obtained by the cross-cutting of a surface of each of the cured films on test substrates to a grid of 100 squares were subjected to a peeling test using a cellulose tape and the number of peeled sheets was examined.

[pencil hardness] The measurement was conducted according to JIS K 5400.

[resolution] Aperture states at the time of alkali development on substrates were observed by using an electron microscope.

[soldering heat resistance] Test pieces were floated on a 260° C. solder bath for one minute, the presence/absence of swelling was observed, and the evaluation was made by the following ratings.

⊚ . . . no swelling, ○ . . . some with swelling, × . . . all with swelling

[chemical resistance] Test pieces were immersed in 10% sulfuric acid, a 10% sodium hydroxide aqueous solution, isopropyl alcohol, methanol, and methylethylketone at room temperature for 30 minutes, and outer appearances were observed.

○ . . . no change in outer appearance, × . . . a change in outer appearance was confirmed

[folding endurance] According to JIS C 6471, the folding was conducted by a MIT folding endurance tester under the condition of R=0.8 mm and a 4.9N load, and the number of folding times until a crack occurred in resists was measured.

TABLE 4

| | example | | | | | | | |
|---|---|---|---|---|---|---|---|---|
| | 1 | 2 | 3 | 4 | 5 | 6 | 7 | 8 |
| flame retardancy | V-0 | V-0 | V-0 | V-0 | V-0 | V-0 | V-0 | V-0 |
| insulation resistance ($\times 10^{14}$ Ω) | 2.5 | 2.0 | 2.5 | 2.5 | 2.0 | 3.0 | 3.0 | 3.5 |
| combustion gas analysis (g/100 g) | 0 | 0 | 0 | 0 | 0 | 0 | 0 | 0 |
| adhesiveness | 100/100 | 100/100 | 100/100 | 100/100 | 100/100 | 100/100 | 100/100 | 100/100 |
| pencil hardness | 3H | 3H | 3H | 3H | 3H | 3H | 3H | 3H |
| resolution | φ75 μm aperture | φ75 μm aperture | φ75 μm aperture | φ75 μm aperture | φ75 μm aperture | φ75 μm aperture | φ75 μm aperture | φ75 μm aperture |
| soldering heat resistance | ⊚ | ⊚ | ⊚ | ⊚ | ⊚ | ⊚ | ⊚ | ⊚ |
| chemical resistance | ○ | ○ | ○ | ○ | ○ | ○ | ○ | ○ |
| folding endurance | 400 | 350 | 350 | 350 | 400 | 400 | 450 | 420 |

TABLE 5

| | example | | | | | | | |
|---|---|---|---|---|---|---|---|---|
| | 9 | 10 | 11 | 12 | 13 | 14 | 15 | 16 |
| flame retardancy | V-0 | V-0 | V-0 | V-0 | V-0 | V-0 | V-0 | V-0 |
| insulation resistance ($\times 10^{14}$ Ω) | 2.5 | 2.0 | 2.5 | 2.5 | 2.0 | 3.0 | 3.0 | 3.5 |
| combustion gas analysis (g/100 g) | 0 | 0 | 0 | 0 | 0 | 0 | 0 | 0 |
| adhesiveness | 100/100 | 100/100 | 100/100 | 100/100 | 100/100 | 100/100 | 100/100 | 100/100 |
| pencil hardness | 3H | 3H | 3H | 3H | 3H | 3H | 3H | 3H |
| resolution | φ75 μm aperture | φ75 μm aperture | φ75 μm aperture | φ75 μm aperture | φ75 μm aperture | φ75 μm aperture | φ75 μm aperture | φ75 μm aperture |
| soldering heat resistance | ⊚ | ⊚ | ⊚ | ⊚ | ⊚ | ⊚ | ⊚ | ⊚ |
| chemical resistance | ○ | ○ | ○ | ○ | ○ | ○ | ○ | ○ |
| folding endurance | 450 | 350 | 350 | 350 | 400 | 400 | 450 | 420 |

TABLE 6

|  | comparative example | | | | |
|---|---|---|---|---|---|
|  | 1 | 2 | 3 | 4 | 5 |
| flame retardancy | V-0 | V-0 | X | X | X |
| insulation resistance ($\times 10^{14}\,\Omega$) | 1.5 | 3.0 | 3.5 | 2.0 | 2.0 |
| combustion gas analysis (g/100 g) | 4.5 | 3 | 3 | 2.5 | 1.5 |
| adhesiveness | 100/100 | 100/100 | 100/100 | 100/100 | 100/100 |
| pencil hardness | 3H | 3H | 3H | 3H | 3H |
| resolution | φ75 μm aperture | φ75 μm aperture | φ75 μm aperture | φ75 μm aperture | φ75 μm aperture |
| soldering heat resistance | ◎ | ◎ | ◎ | ◎ | ◎ |
| chemical resistance | ○ | ○ | ○ | ○ | ○ |
| folding endurance | 350 | 250 | 300 | 350 | 375 |

It has been seen from these results that the photosensitive thermosetting resin composition of the present invention has excellent performance in all the properties comparable to those of conventional compositions using brominated epoxy resin and a halogen-based flame retardant, and has an excellent property of not producing hydrogen bromide which has been a problem at the time of the combustion.

Industrial Applicability

The photosensitive thermosetting resin composition of the present invention is widely usable as a photosensitive thermosetting resin composition of an alkali development type.

What is claimed is:

1. A photosensitive thermosetting resin composition of an alkali development type, comprising:
   (A) a resin component having a (meth)acryloyl group and a carboxyl group in one molecule and soluble in a dilute alkali solution;
   (B) a phosphorus-containing epoxy thermosetting component;
   (C) a photopolymerization initiator;
   (D) a cyano phenoxy phosphazene compound or a cyanate phenoxy phosphazene compound as an organophosphorus compound other than said (B) component; and
   (E) a diluent.

2. The photosensitive thermosetting resin composition according to claim 1, further comprising (F) a phosphorus-containing photopolymerizable monomer component other than said (B), (D), and (E) components.

3. The photosensitive thermosetting resin composition according to claim 2, wherein (F) said phosphorus-containing photopolymerizable monomer contains a phosphorus-containing (meth)acryloyl compound which is derived by a reaction between a polyfunctional (meth)acryl compound having three or more (meth)acryloyl groups in a molecule and at least one kind among said phosphorus compounds represented by the formulas (1), (2), and (3), with an equivalent weight of the organophosphorus compound being 0.1 to 0.7 per one equivalent weight of the (meth)acryloyl group.

4. The photosensitive thermosetting resin composition according to claim 1,
   wherein (B) said phosphorus-containing epoxy thermosetting component is a phosphorus-containing epoxy thermosetting component which is derived by a reaction between (G) a component represented by the following formula (1), (2), or (3)

[formula 1]

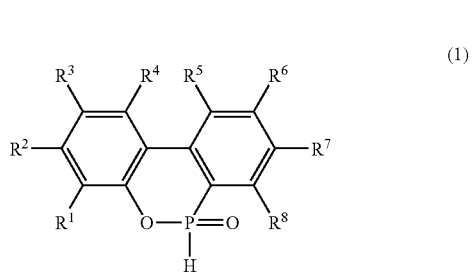

[formula 2]

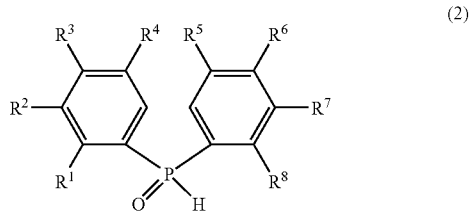

[formula 3]

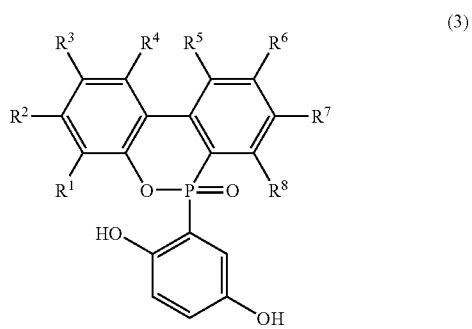

(in the formulas (1) to (3), $R^1$, $R^2$, $R^3$, $R^4$, $R^5$, $R^6$, $R^7$, $R^8$ are the same or different, each representing a hydrogen atom, or a monofunctional aliphatic group or aromatic group) and (H) a component made of epoxy resin having two or more epoxy groups in a molecule.

5. The photosensitive thermosetting resin composition according to claim 1, wherein in (B) said phosphorus-containing epoxy thermosetting component, a phosphorus content ratio is 1 to 10 mass % and an weight per epoxide equivalent is 150 g/eq to 800 g/eg.

6. The photosensitive thermosetting resin composition according to claim 1, wherein the phosphazene compound contains a phosphazene oligomer represented by the following formula (4) or (5)

[formula 4]

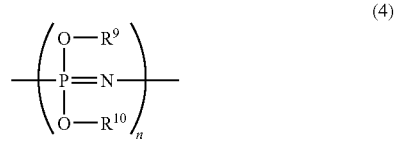

[formula 5]

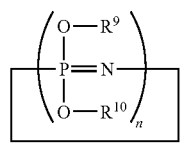

(5)

(in the formulas (4) to (5), $R^9$ and $R^{10}$ each are a monovalent organic group not containing a hydrogen atom or halogen, and n is an integer from 3 to 10).

7. The photosensitive thermosetting resin composition according to claim 1, wherein (D) said organophosphorus compound contains, in addition to the phosphazene compound, at least one kind selected from:

a phosphoric acid melamine compound represented by the following formula (6)

[formula 6]

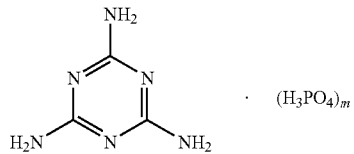

(6)

(where m is 1 to 10);

phosphinate represented by the following formula (7) or (8)

[formula 7]

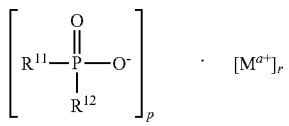

(7)

(in the formula, $R^{11}$ and $R^{12}$ are the same or different, each being an alkyl group with a carbon number of 1 to 6 or an aryl group with a carbon number of 6 to 12 which is straight- or branch-chained, $M^{q+}$ is at least one ion selected from ionized Mg, Ca, Al, Sb, Sn, Ge, Ti, Zn, Fe, Zr, Ce, Bi, Sr, Mn, Li, Na, and K and a protonated nitrogenous base, p is 1 to 4, q is 1 to 4, r is 1 to 4, and p=q.times.r is satisfied),

[formula 8]

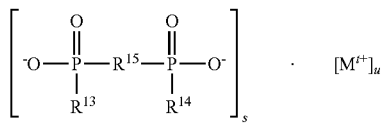

(8)

(in the formula, $R^{13}$ and $R^{14}$ are the same or different, each being an alkyl group with a carbon number of 1 to 6 or an aryl group with a carbon number of 6 to 12 which is straight- or branch-chained, $R^{15}$ is an alkylene group with a carbon number of 1 to 10, an arylene group with a carbon number of 6 to 10, an alkylarylene group with a carbon number of 6 to 10, or an arylalkylene group with a carbon number of 6 to 10 which is straight- or branch-chained, $M^{t+}$ is at least one ion selected from ionized Mg, Ca, Al, Sb, Sn, Ge, Ti, Zn, Fe, Zr, Ce, Bi, Sr, Mn, Li, Na, and K and a protonated nitrogenous base, s is 1 to 4, t is 1 to 4, u is 1 to 4, and 2.times.s=t.times.u is satisfied); and an organophosphorus compound represented by the following formula (9)

[formula 9]

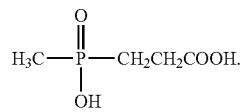

(9)

8. The photosensitive thermosetting resin composition according to claim 1, wherein per 100 parts by mass of (A) said resin component soluble in the dilute alkali solution, 1 to 100 parts by mass of (B) said phosphorus-containing epoxy thermosetting component, 1 to 50 parts by mass of (C) said photopolymerization initiator, 1 to 50 parts by mass of (D) said phosphazene compound, and 1 to 100 parts by mass of (E) said diluent are contained.

9. A flexible printed circuit board including a polyimide layer and a copper layer or including a polyimide layer, an adhesive layer, and a copper layer, the flexible printed circuit board comprising: a resin layer provided on a surface of the flexible printed circuit board and made of the photosensitive thermosetting resin composition according to claim 1.

10. The photosensitive thermosetting resin composition according to claim 1, further comprising an epoxy resin curing agent other than component (B).

11. The photosensitive thermosetting resin composition according to claim 10, wherein the epoxy resin curing agent other than component (B) is present in an amount of from 0.01 to 25 parts by mass, based on 100 parts by mass of component (A).

12. The photosensitive thermosetting resin composition according to claim 10, wherein the epoxy resin curing agent other than component (B) is present in an amount of from 0.1 to 15 parts by mass, based on 100 parts by mass of component (A).

13. The photosensitive thermosetting resin composition according to claim 10, wherein the phosphazene compound is a cyano phenoxy phosphazene compound.

14. The photosensitive thermosetting resin composition according to claim 10, wherein the phosphazene compound is a cyanate phenoxy phosphazene compound.

* * * * *